United States Patent [19]

Walker, III et al.

[11] Patent Number: 5,049,814

[45] Date of Patent: Sep. 17, 1991

[54] TESTING OF INTEGRATED CIRCUITS USING CLOCK BURSTS

[75] Inventors: Robert M. Walker, III, Atherton; Dick L. Liu, Saratoga, both of Calif.

[73] Assignee: LSI Logic Corporation, Milpitas, Calif.

[21] Appl. No.: 457,910

[22] Filed: Dec. 27, 1989

[51] Int. Cl.[5] .......................................... G01R 31/28
[52] U.S. Cl. ............................... 324/158 R; 324/73.1; 371/25.1
[58] Field of Search ................. 324/73.1, 72.5, 158 R, 324/158 T, 22.1, 25.1

[56] References Cited

U.S. PATENT DOCUMENTS

| | | | |
|---|---|---|---|
| 3,614,608 | 10/1971 | Giedd | 324/73.1 |
| 3,882,386 | 5/1975 | Vinsani | 324/72.5 |
| 3,946,310 | 3/1976 | Saper et al. | 324/72.5 |
| 4,357,703 | 11/1982 | Van Brunt | 324/158 T |
| 4,484,329 | 11/1984 | Slamka et al. | 371/25.1 |

Primary Examiner—Ernest F. Karlsen
Attorney, Agent, or Firm—Skjerven, Morrill, MacPherson, Franklin & Friel

[57] ABSTRACT

A method of testing integrated circuits at high operating speeds is provided which is applicable to sequential logic circuits such as ASICs. A general purpose ASIC tester applies test vectors to the integrated circuit under test. The logic input signals are held unchanged and a series of high speed clock signals (a clock burst) are applied to the clock terminals of the integrated circuit. These clock signals are provided at the speed at which it is desired to test the integrated circuit. Then the output terminals are observed to determined if the device is in the expected state (as determined by simulation) after the clock burst. The process is repeated until no further output terminals change state, and then the device may be reinitialized and another series of state changes initiated. Thus every path in the circuit may be tested at high speed by a conventional low speed tester.

9 Claims, 3 Drawing Sheets

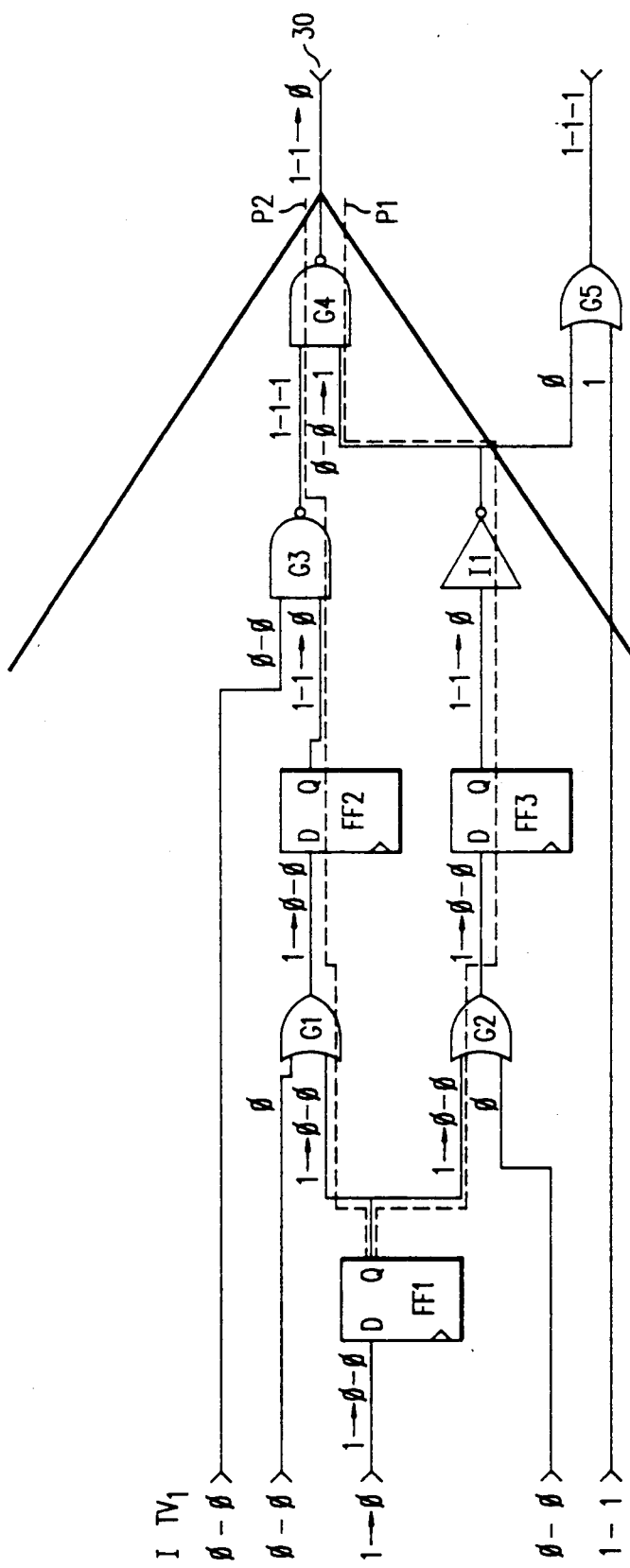
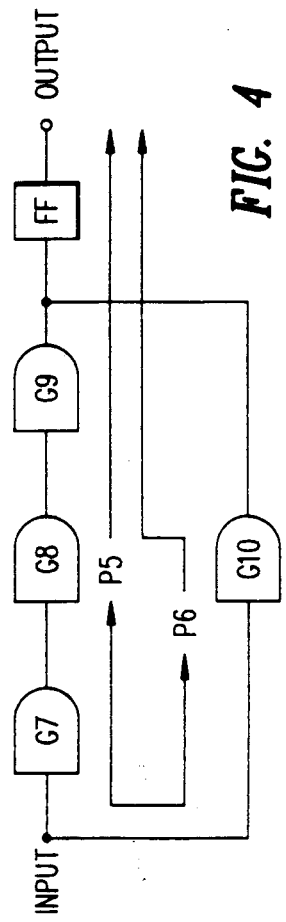
I : INITIAL STATE INPUT PATTERN
TV₁: STATE A INPUT PATTERN
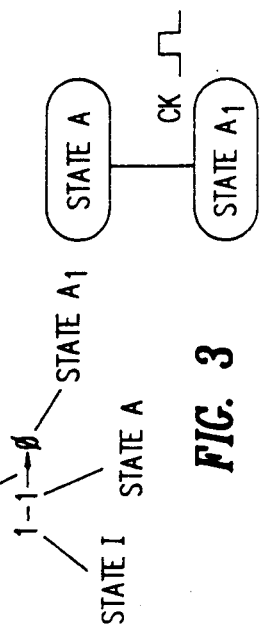
FIG. 3
FIG. 4

TESTING OF INTEGRATED CIRCUITS USING CLOCK BURSTS

BACKGROUND OF THE INVENTION 1. 9 Field of the Invention

This invention relates to testing electronic circuits at high operating speeds. More specifically, the invention relates to a method and device for testing of state machines using high speed clock signals.

2. Description of the Prior Art

It is well known that testing of electronic circuits at high operating speeds is difficult. In particular, testing at high speeds of high pin count application specific integrated circuits (ASICs) traditionally has required multi-million dollar tester equipment and man-months of test engineering for each design. As integrated circuits have achieved faster operating speeds over the years and include more input and output pins, testing such devices has become increasingly complex. To actually change the voltages, i e., input signals, on several hundred input terminal pins and then observe the output signals on several hundred other output terminal pins at high speeds is relatively difficult. Especially in the case of ASICs, which are typically produced in relatively small volume quantities, the engineering cost required to devise tests for such circuits at high speeds becomes prohibitive. Therefore in general such circuits are not tested at their rated speeds because to do so is beyond the capability of a particular tester or is inordinately expensive in terms of test engineering resources.

As is well known in the art, integrated circuits are typically subject to functional testing, in which input signals are provided to all of the input terminals of the integrated circuit and one observes the output signals on the output terminals in order to verify that the circuit is functioning as desired. One problem with the prior art is that functional testing for complex integrated circuits is typically carried out at an operating speed much lower than that at which the circuit is intended to operate in its particular application. Thus, an integrated circuit may pass the functional testing but not perform properly at its actual rated speed. For instance, the functional testing might occur at 10 mHz whereas the particular circuit has a rated speed of 30 mHz. Even though the integrated circuit passes the functional testing at 10 mHz, in the actual application by the user of the integrated circuit, the circuit might not function as desired at 30 mHz, because particular devices in the circuit may not operate at 30 mHz.

A typical case of a device on an integrated circuit which would pass the functional testing but not high speed testing is a transistor in the integrated circuit which is operating, but very weakly. Thus, for instance, instead of having an on-resistance of 2,000 ohms, as desired, it might have an on-resistance of 20,000 ohms. The circuit would then operate, but only at a much lower speed than was specified. Testing such circuits functionally at the higher operating speed requires changing all of the input signals, of which there might be 200 or more, at for instance the 30 mHz speed and then observing all of the output signals on the output pins, of which there again might be 200 or more. Each of the input and output signals would have to be observed to be in the correct desired state. This is a very expensive method due to the need to measure output pin states in an environment of capacitive and inductive coupling at high speeds. The electrical transients generated can easily cause good IC's to fail the test. Up to now the solution for at-speed testing has been custom "Device under Test" (DUT) boards and up to a man-year of fine tuning for testing each IC design.

Therefore, while functional testing of integrated circuits is relatively easy, testing of integrated circuits at their operating speed, often called "at speed" testing, is relatively difficult, expensive, time consuming and typically is not performed for application specific integrated circuits. This is undesirable because integrated circuits which do not meet their specific operating speed may be provided to circuit users. The defect in the circuits is only determined after they are installed in a user's system, causing significant expense.

It is well known in the art that logic circuits for digital systems may be combinational or sequential. A combinational circuit includes logic gates whose outputs at any time are determined directly from the present combination of input signals, without regard to previous input signals. Thus the outputs at any instant in time of a combinational circuit are entirely dependent upon the inputs present at that time. The second kind of logic circuit is a sequential circuit, which includes memory elements in addition to logic gates. The outputs of the logic gates are a function of the inputs and the state of the memory elements. The state of the memory elements, in turn, is a function of previous inputs. As a result, the output signals of a sequential circuit depend not only on the present inputs but also on past inputs, and therefore the circuit behavior is specified by a time sequence of inputs and internal states. The next state of the memory elements is also a function of external inputs in the present state. A sequential circuit, therefore, is a type of a state machine.

As also is well known in the art, an electronic clock is often used to control the timing of a digital system. Typically the output of a memory element is allowed to change states only when a pulse, i.e., a clock signal, is present and the speed of the system is fixed by the clock frequency. Because the clock signal synchronizes the timing, such systems are typically referred to as synchronous. Sequential networks in a digital system are typically synchronous.

As is well known in the art, conventional testing of integrated circuits that are state machines involves putting the circuit in state A, introducing some change ("test vectors") on one or more input terminal pins, then introducing a clock pulse to put the circuit in state B, observing state B, changing the input signals again to go to state C, observing state C, etc. This functional testing checks for each state of the signals on the output pins to determine if the circuit elements involved in each state transition are functioning correctly. Each state transition, if successfully accomplished, indicates that the certain elements or components involved in that state transition are functioning properly. Thus certain elements may be checked off on a list as being functional. This procedure is called fault grading. Ultimately, after having stepped through a large number of such state transitions, most individual devices, i.e., transistors, have been tested.

SUMMARY OF THE INVENTION

In accordance with the invention, a method of testing electronic circuits which are state machines is provided in which the input signals to the input terminals of the circuit are held constant and a series of high speed clock signals are provided to the clock input terminals of the circuit. Thus the circuit will change state or should change state if it is operating properly. The clock signals are stopped and then the signals at one or more output pins of the circuit are expected to have changed due to the clock burst. (The number of clock signals required is determined through conventional logic simulation.) After a suitable delay to allow circuit transients to die out, the output pins are measured to determine if the internal logic is in the expected state. This process may be repeated for different state changes. At each state change, those circuit elements which are involved in the state change are indicated on a "path" fault list as functioning correctly at the speed of the clock signals. This process is repeated until (as desired) some or all of the elements of the integrated circuit have been tested.

The method of the invention takes advantage of the situation that while it is very difficult to observe changes in numerous output signals at high speed, it is relatively easy to provide a high speed clock signal on one or two input clock pins and it is relatively easy to observe states after the clock signal is turned off. Thus, in accordance with the invention the clock signal need be provided only to typically one or two or three input clock terminals, while the input data signals are provided and the output signals observed at much lower speed.

In accordance with one embodiment of the invention, this high speed clock burst method is used after the entire circuit has been tested conventionally by functional testing. Also in accordance with the invention, it is determined by means of logic simulation of the circuit how many clock signals are required to obtain a state change which is reflected in an output pin change. The clock signals may be provided to change the circuit from state to state sequentially, so long as new paths were being listed and to initialize back to the initial stage and then change to another state in the functional test and begin the sequence again.

The above method is applicable only to sequential circuits. This is not a significant limitation, because the circuits of the type in which testing is most difficult are generally sequential circuits. The invention is implementable using standard test equipment with a modification to the software which typically controls such equipment.

Also in accordance with the invention, the above invention is applicable not just to integrated circuits but to any electronic system (including board level systems) which are state machines. Since in accordance with the invention high speed testing is divorced from the provision of the input and output signals, it is possible to retrofit older testers which operate, for instance, at 10 mHz, to test integrated circuits at 30-50 mHz or even higher speeds, without significant modification to the equipment. This beneficially allows use of older, relatively inexpensive testers to perform high speed testing. Also, even when the invention is used with high-speed testers, the benefit is provided that less time is needed in terms of test engineering manpower to devise high speed tests.

BRIEF DESCRIPTION OF THE DRAWINGS

FIG. 3 shows path testing.

FIG. 4 shows critical paths.

DETAILED DESCRIPTION OF THE INVENTION

Figure 1:
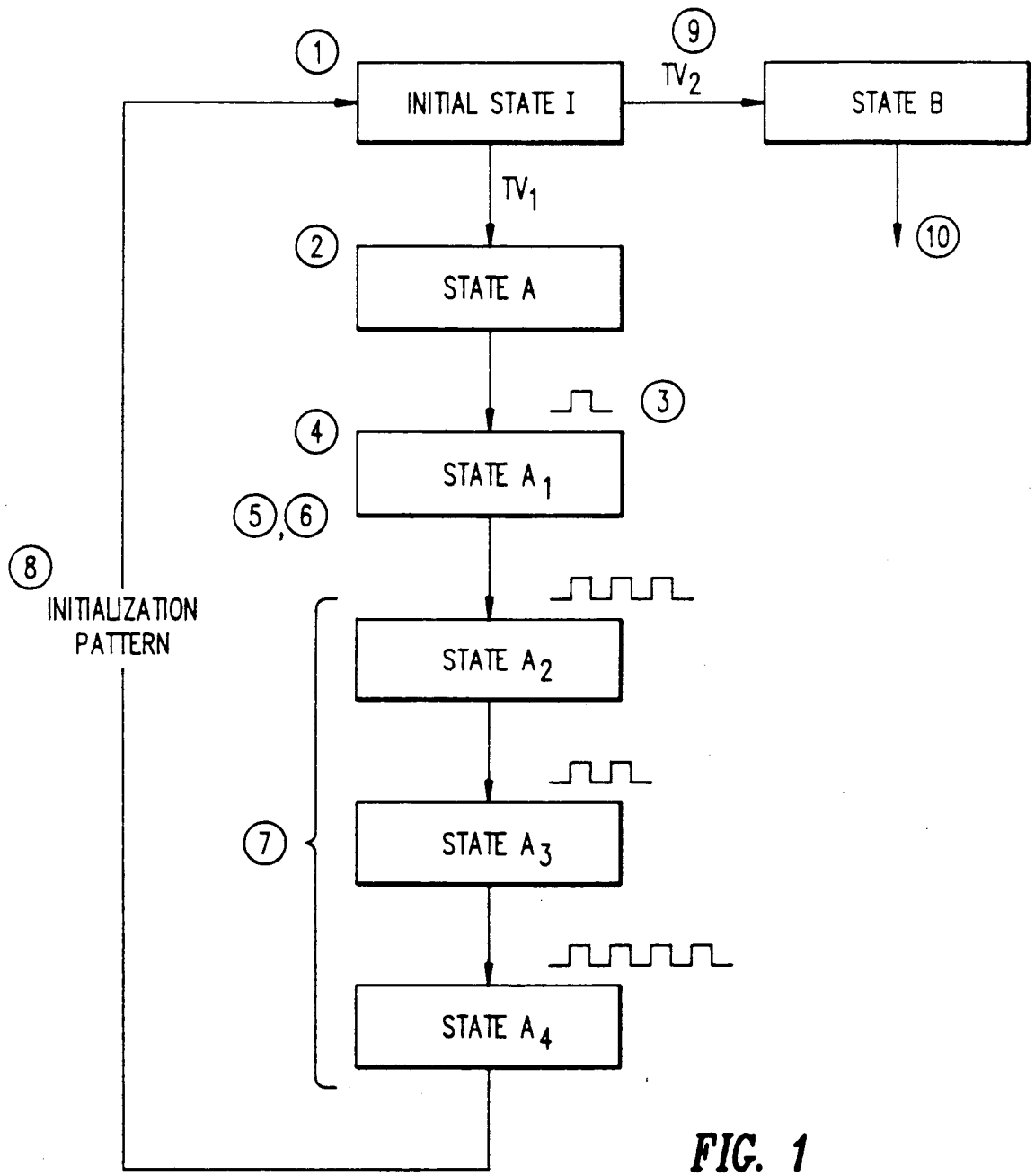
FIG. 1 shows a test procedure in accordance with the invention.

The following with reference to FIG. 1 describes a procedure in accordance with one embodiment of the invention to perform high speed testing.

1. An integrated circuit (IC) is conventionally connected to a general purpose tester, for instance a VLSI tester of the commercially available from Sentry, Ando, Trillium, or Tektronix. The integrated circuit is put into an initial state I by a conventional reset or an initialization pattern of input signals.

2. A test vector $TV_1$ (i.e., input signals) conventionally used to test the functionality of the device for functional testing is applied to the circuit's input terminals at the usual rate, and the circuit is driven to a known state A.

3. The input signals $TV_1$ to the logic input terminals of the integrated circuit are held unchanged, the output signals are made "don't care" for the tester, and a series of typically two to some maximum specified number of high speed clock pulses (a clock burst) at a predetermined frequency are applied to the clock input terminals of the circuit under test.

4. Optionally, if available in the IC under test, the output pins of the IC may be driven to a high impedance "off" state during the clock burst. This reduces inductive and capacitive cross coupling from output to input which could cause momentary false inputs.

5. The number of clock signals applied (here shown as one) is sufficient to cause at least one output terminal to show a change of state on a "good", i.e., functional, circuit from state A to state A1.

6. After a delay, determined by the IC's operating speed, the output terminals are observed to determine if the device under test is in the expected state A1.

7. The above process (steps 3-5) is repeated, driving the circuit sequentially to states $A_2$, $A_3$, and $A_4$ by application of clock bursts of selected lengths until no further output terminals change states in some reasonable number of clock signals per burst.

8. The state of the circuit is reinitialized by an initialization pattern.

9. The integrated circuit is driven to a new state B using a new functional test vector $TV_2$.

10. Steps 3-6 above are repeated (not shown) beginning with state B.

11. This procedure as described above is continued through all the functional test patterns, or optionally until sufficient path coverage is obtained.

The result of these tests is to check that a number of internal paths in the circuit meet maximum delay specifications, i.e., operate at the desired speed. This desired speed corresponds to the frequency of the clock signals supplied. A report is then generated by the tester which details the completeness of the testing.

This testing technique does not test for input pin set-up-and-hold times or clock-to-output pin delays. These are tested conventionally by functional testing.

In accordance with the invention, the tester program (i.e., computer software) which carries out the above series of steps is generated by a modified conventional CAD system. The CAD system as modified simulates the network, i.e., the circuitry of the integrated circuit, and uses the so-generated model of the integrated circuit to generate the appropriate test program. The model path delays are checked in a path dictionary to determine that a "good" integrated circuit will meet the test parameters. A report is generated showing path coverage, i.e., if not every path is being checked. The program may also perform optimization, such as selecting tests that measure critical paths (explained below) or to remove redundant tests.

As noted above, high speed testing in accordance with the invention is typically (but not necessarily) performed in conjunction with normal functional testing for current, leakage, impedance, or other typical ASIC test parameters. The computer software which performs the testing in accordance with the invention is provided to the controller of above described commercially available VLSI testers. Typically these testers have a clock pulse generation circuit built in. If such a circuit is not built in, it may be provided simply as a conventional high speed clock signal generator added to the circuitry of the tester.

In accordance with the invention, the clock bursts are applied at a frequency approximately equal to or some small percentage greater than the specified operating speed of the integrated circuit to take into account effects of temperature and supply voltage. The clock burst frequency is sufficient so as to guarantee operation of the integrated circuit at the specified speed. The applied clock burst signals are applied to the clock input terminal or terminals of the integrated circuit. If the integrated circuit has more than one clock input terminal, all clock signals provided are synchronous and in lock step.

Figure 2A:
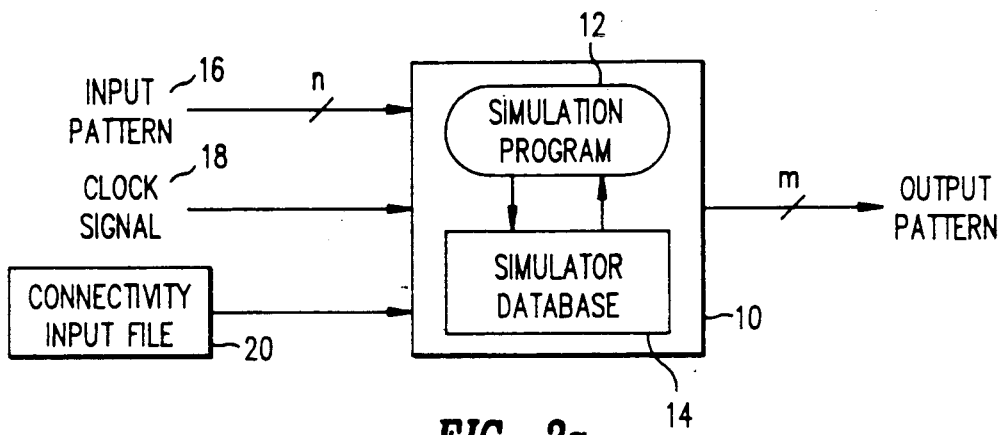
FIGS. 2a to 2c show a simulator in accordance with the invention.

The above-described CAD simulation is performed by a simulator 10 (i.e., a computer program) shown in block diagram form in FIG. 2a. Simulator 10 includes a simulation program 12 and simulator database 14. Simulator accepts as input data test input patterns 16, clock signal data 18, and a connectivity input file 20. Connectivity input file 20 (also referred to as a "net list") describes the circuit components and interconnections and does not change during the simulation run. Simulation program 12 operates on simulator database 14.

Figure 2B:
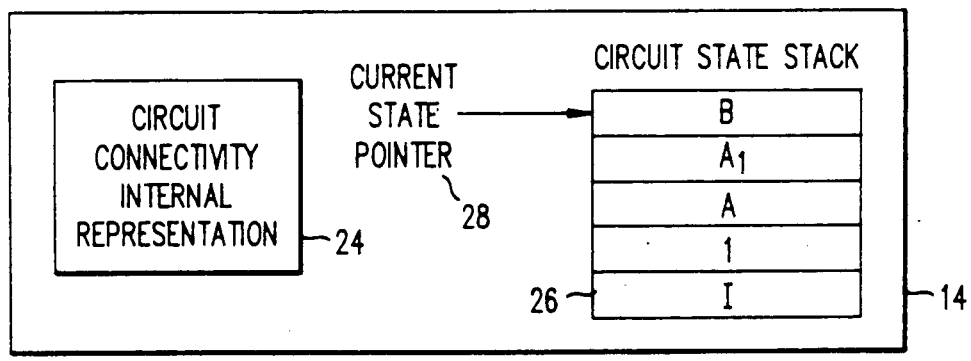
Figure 2C:
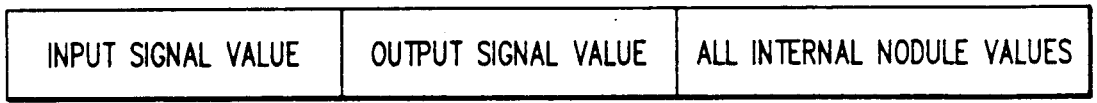

Database 14 includes, as shown in FIG. 2b, a circuit connectivity internal representation 24 and circuit state data kept in the circuit state stack 26 (which can be implemented as a linked list) showing circuit states B, A1, A, . . . , I with a current state pointer 28 indicating the current simulated circuit state. Each state B, A1, A, . . . , I is uniquely defined in the stack as in FIG. 2c by the values of its input signal values (i.e., the input pattern), output signal values (the state), and all internal nodal values (i.e., the state of each memory element in the circuit).

Simulator 10 also has the capabilities to store multiple copies of the circuit state data as is evident by the state stack; to compare the output signal values between two different circuit states, and to report any difference in signal values; to declare any state in database 14 as the current state by use of the pointer; and to perform delay path fault grading, as described below.

By using the simulator, it is possible to backtrace from a particular state of the output terminals of the circuit by reversing back into the logic on the circuit to determine which of the gates, flip-flops, and latches were involved in any state change. This is a conventional cone-type backtrace. The cone-type backtrace is conventionally used in automatic test pattern generation for tracing from the output terminals backward to the input terminals.

The cone-type backtrace is used uniquely in accordance with the invention as shown in FIG. 3. Input test signal I is the initial state input pattern applied to the input terminals of the circuit as shown. Test vector $TV_1$ is the signal pattern to drive the circuit to state A from state I. With the circuit at state A, application of a clock (CK) burst to a clock input terminal (not shown) drives the circuit to state A1. Observation of state A1 at output terminal 30 (value 0) forms the vertex of the cone shown by the dark heavy lines.

Thus using the results of the above-described cone-type simulation of the circuit, with reference to FIG. 3, the simulation determines that there is a particular path P1 from flip-flop FF3, gate G2, flip-flop FF3, inverter I1 and gate G4, and that the signal had to propagate through path P1 for the circuit to have changed to the state A1. Thus, one can conclude if the physical (non-simulated) circuit did reach the state A1 from state A, then the path P1 has been tested. Thus, since there are many paths P1, . . . , Pn through the circuit, another path P2 may go through flip-flop FF1, gate G1, flip-flop FF2, and gates G3 and G4, and that path P2 was not tested. Thus, one refers to a path fault dictionary and checks off physical gates G2 and G4 and inverter I1 as having been tested and the settling time of flip-flop FF1 and also the set-up time of flip-flop FF3 as having been tested by path P1. Thus, each of these real circuit components has been found to be functioning at the tested speed.

The simulated circuit is now in state A1. By the previous simulation, it has been determined that if the circuit is provided with another set of clock pulses (such as three clock pulses) the circuit should go into another state designated A2 where output terminal 30 would indicate A2. Then one can provide the three clock pulses in the actual physical testing and determine if the components gate G1, flip-flop FF2, and gate G3 in the second path P2 are in working order. If in the simulation it is determined that a particular maximum number of clock pulses such as for instance 16, does not result in the provision of any new states, then one can return the simulated circuit to the initial state by popping states B, A1, A, . . . , off the stack and setting the current state pointer to state I in the simulation and then beginning the provision of simulated clock pulses again.

Initialization of the circuit in the physical testing is performed by provision of an initialization pattern and/or provision of a signal on a conventional reset pin. The physical testing continues by reversion to the initial state of the circuit before each new test vector is provided. The physical circuit goes from state I to state B following application of a test vector and then for instance two clock pulses. At state B the simulation indicates that if logic inputs constant are held and a certain number of clock pulses are provided, the circuit should go into a different state B1 (not shown in FIG. 1) whereby an output pin signal changes. At simulation this indicates that transition to this state checks that a certain path has been tested. Thus a particular path has already been tested and it is not necessary to test that path again. Therefore one may go on from state B1 to other states, and test the paths for each state.

Also in accordance with the invention, one can subject a circuit to variable critical path testing. In an example in FIG. 4, path P5 includes three gates G7, G8, G9 and path P6 includes only one logic gate G10. It is determined at the time of test simulation that only critical paths are of concern. Critical paths, as is known in the art, are those paths the transit time of which by a signal from input to output determines the fastest operating speed of the circuit. Thus, path P5 is more likely to be a critical path than is path P6. In variable critical path testing, one tests only those relatively long time-of-transit critical paths such as P5 and ignores the shorter (i.e., faster) paths such as P6, and the threshold value for determining paths to be critical is preset by the users. This provides a shorter and quicker test procedure and therefore cheaper testing. Variable critical path testing is consistent with the present invention. Thus only critical paths may be tested in accordance with the invention, by a procedure in which during the simulation the non-critical paths are eliminated as paths to be tested.

The above description of the invention is descriptive and not limiting. Further embodiments of the invention will be apparent to one of ordinary skill in the art in the light of the disclosure and appended claims.

We claim:

1. A method of testing an electronic circuit having a plurality of sequential logic elements comprising the steps of:
    applying test signals to logic input terminals of the circuit;
    observing output signals at output terminals of the circuit so that the output signals are in a known state;
    applying at least two clock signals to a clock input terminal of the circuit at a predetermined frequency;
    observing the output signals at the output terminals of the circuit during a period when no clock signals are applied for purposes of testing the circuit; and
    comparing the output signals to expected output signals to determine if the circuit functions at the predetermined frequency for substantially all the elements of the plurality of sequential logic elements.

2. The method of claim 1, further comprising the steps of:
    reinitializing a state of the circuit;
    providing a second set of test signals different from those applied previously to the input terminals; and
    repeating the steps of observing, applying, and comparing.

3. The method of claim 1 wherein the step of applying comprises applying a burst of clock pulse signals, said burst having a predetermined number of clock signals.

4. The method of claim 1, further comprising the step of determining the expected output signals by simulating by a computer program operation of the circuit.

5. The method of claim 1, further comprising the step of path grading the circuit so as to test desired portions of the circuit.

6. The method of claim 5, wherein the step of path grading further comprises the step of providing a path fault dictionary to determine which portions of the circuit have been tested.

7. The method of claim 1, wherein the predetermined frequency is greater than a specified operating frequency of the circuit.

8. The method of claim 1, wherein the step of applying at least one clock signal includes the step of applying to each of the clock input terminals of the circuit clock signals that are synchronous and in lock step.

9. The method of claim 4, wherein the step of determining includes the step of determining which components of the circuit are involved in a particular state change by back tracing by the computer program from a particular output terminal.

* * * * *